(12) United States Patent
Tentzeris et al.

(10) Patent No.: US 9,343,233 B2
(45) Date of Patent: May 17, 2016

(54) ADDITIVELY DEPOSITED ELECTRONIC COMPONENTS AND METHODS FOR PRODUCING THE SAME

(71) Applicant: Georgia Tech Research Corporation, Atlanta, GA (US)

(72) Inventors: Manos Tentzeris, Atlanta, GA (US); Benjamin Cook, Atlanta, GA (US)

(73) Assignee: GEORGIA TECH RESEARCH CORPORATION, Atlanta, GA (US)

(*) Notice: Subject to any disclaimer, the term of this patent is extended or adjusted under 35 U.S.C. 154(b) by 93 days.

(21) Appl. No.: 14/250,878

(22) Filed: Apr. 11, 2014

(65) Prior Publication Data

US 2014/0307363 A1 Oct. 16, 2014

Related U.S. Application Data

(60) Provisional application No. 61/810,910, filed on Apr. 11, 2013.

(51) Int. Cl.
*H01G 4/18* (2006.01)
*H01G 4/008* (2006.01)
(Continued)

(52) U.S. Cl.
CPC ............... *H01G 4/18* (2013.01); *H01G 4/008* (2013.01); *H01G 4/33* (2013.01); *H01L 28/10* (2013.01); *H01L 28/40* (2013.01)

(58) Field of Classification Search
CPC ............ H01G 4/18; H01G 4/008; H01G 4/33
USPC .............. 361/305, 303, 301.1, 301.2, 301.5, 361/311–313, 306.1, 306.3, 321.1, 321.2
See application file for complete search history.

(56) References Cited

U.S. PATENT DOCUMENTS

| 7,722,920 B2 | 5/2010 | Mickle et al. |
| 7,733,626 B2 * | 6/2010 | Palanduz ............. H01G 4/12 361/305 |
| 7,842,946 B2 | 11/2010 | Lin et al. |

(Continued)

FOREIGN PATENT DOCUMENTS

| DE | 102010044299 A1 | 3/2012 |
| WO | WO2010068469 A1 | 6/2010 |
| WO | WO2010126876 A1 | 11/2010 |

OTHER PUBLICATIONS

Cook, et al.; Multi-Layer RF Capacitors on Flexible Substrates Utilizing Inkjet Printed Dielectric Polymers; IEEE Microwave Component Letters; pp. 1-4; vol. 23; Issue: 7; Jul. 2013.

(Continued)

*Primary Examiner* — Nguyen T Ha
(74) *Attorney, Agent, or Firm* — Troutman Sanders LLP; Ryan A. Schneider; Dustin B. Weeks

(57) ABSTRACT

An exemplary embodiment of the present invention provides a passive electrical component comprising a substrate, a first electrically conductive layer, a first dielectric layer, and a second electrically conductive layer. The first electrically conductive layer can be additively deposited on the substrate. The first dielectric layer can be additively deposited on the first conducive layer. The first dielectric layer can comprise a cross-linked polymer. The second electrically conductive layer can be additively deposited on the first dielectric layer. The resonant frequency of the passive electrical component can exceed 1 gigahertz.

36 Claims, 5 Drawing Sheets

(51) Int. Cl.
*H01G 4/33* (2006.01)
*H01L 49/02* (2006.01)

(56) References Cited

U.S. PATENT DOCUMENTS

| | | |
|---|---|---|
| 8,334,464 B2 | 12/2012 | Edwards et al. |
| 8,404,160 B2 | 3/2013 | Li et al. |
| 8,435,603 B2 | 5/2013 | Bentley et al. |
| 2006/0260493 A1 | 11/2006 | Travis et al. |
| 2011/0127504 A1* | 6/2011 | Halls ............... H01L 51/052 |
| | | 257/40 |
| 2012/0026043 A1 | 2/2012 | Rida et al. |
| 2012/0268338 A1 | 10/2012 | Yoo et al. |

OTHER PUBLICATIONS

Rida; Conductive Inkjet Printed Antennas on Flexible Low-Cost Paper-Based Substrates for RFID and WSN Applications; Georgia Institute of Technology; May, 2009.

Yang, et al.; RFID Tag and RF Structures on a Paper Substrate Using Inkjet-Printing Technology; IEEE Transactions on Microwave Theory and Techniques, vol. 55, No. 12, Dec. 2007.

* cited by examiner

ADDITIVELY DEPOSITED ELECTRONIC COMPONENTS AND METHODS FOR PRODUCING THE SAME

CROSS-REFERENCE TO RELATED APPLICATIONS AND PRIORITY CLAIM

This application claims priority to U.S. provisional patent application No. 61/810,910 filed Apr. 11, 2013 entitled Inkjet Printed Multi-Layer mm-wave Antennas and Passive Components.

STATEMENT REGARDING FEDERALLY SPONSORED RESEARCH

This invention was made with Government support under Grant Number Contract CCF-1162063 and Contract ECCS-0801798, awarded by National Science Foundation. The Government has certain rights in the invention.

FIELD OF THE INVENTION

The invention is directed to passive electrical components and more specifically directed to additively deposited electronic components and methods for fabricating the same.

BACKGROUND

Inkjet printing as an electronics fabrication technology has attracted significant attention over the last decade as a method to fabricate passive and active components. Printing of electronics allows for rapid prototyping, low material wastes, and does not require cleanroom environments. Conventional methods of fabricating multi-layer passive structures such as metal-insulator-metal (MIM) capacitors, require a sequence of photolithography and etching steps which use harsh chemicals and waste a large amount of material in the subtractive process. Inkjet printing, however, is a purely additive and non-contact process meaning it only deposits the required material, and can successively deposit multiple layers of different materials without disturbing the previously deposited layers. This makes the process very attractive for multi-layer printing of RF components.

Up until now, low-frequency passives including resistors, capacitors, and inductors have been demonstrated in the literature with resonant frequencies up to 10 MHz utilizing the inkjet process. These low-frequency passives are deposited in a single plane. Multi-layer printed MIM structures have yet to be demonstrated and optimized for operation at microwave frequencies through several GHz. Printed microwave capacitors on flexible substrates have a wide variety of applications, especially in printed wearable systems which currently require the use of discrete mounted components. Accordingly, there is a desire for systems and methods that address the shortcomings of these conventional techniques. Various embodiments of the present invention address these desires.

SUMMARY

In one embodiment, a passive electrical component is provided having a resonant frequency exceeding 1 gigahertz (GHz), which is fabricated by additively depositing a first electrically conductive layer, a first dielectric layer, and a second electrically conductive layer. The first electrically conductive layer is deposited on a substrate. The first dielectric layer is composed of a cross-linked polymer and is deposited on the first conducive layer. The second electrically conductive layer is deposited on the first dielectric layer.

In one embodiment, the passive electrical component has a capacitance below 60 picofarads (pF). In another embodiment, the passive electrical component has a quality factor (Q-factor) exceeding 2, at a signal frequency of 1 gigahertz.

In another embodiment, the cross-linked polymer comprising the first dielectric layer has a molecular weight greater than 500.

In another embodiment, the substrate is flexible.

In another embodiment, the substrate is a silicon wafer having a surface treatment to promote adhesion.

In another embodiment, the first dielectric layer contains the polymer SU-8 and has a total thickness less than 6 micrometers ($\mu m$). In another embodiment, the first dielectric layer contains a polymer formed of a cured mixture of poly (4-vinylphenol) ("PVP") resin and poly melamine-co-formaldehyde ("PMF") cross-linking agent and has a total thickness less than 1 $\mu m$.

In another embodiment, the first and second electrically conductive layers are formed from sintered silver nanoparticles. In this embodiment, the conductivity of each electrically conductive layer exceeds $3 \times 10^6$ S/m and each electrically conductive layer has a total thickness below 3 $\mu m$.

In another embodiment, the passive electrical component further includes at least one surface-mounted connector, which is electrically connected to either the first or second electrically conductive layers.

In one embodiment, a passive electrical component is provided having a form similar to a spiral inductor, which is fabricated by additively depositing a first electrically conductive layer, a first dielectric layer, and a second electrically conductive layer. The first electrically conductive layer is deposited on a substrate. The first dielectric layer is composed of a cross-linked polymer and is deposited on the first conducive layer and the substrate and has two or more deposition-free regions forming vias to the first conductive layer. The second electrically conductive layer is deposited on the first dielectric layer and connects the deposition-free regions of the first dielectric layer, forming a conductive path between the vias.

In one embodiment, a passive electrical component is provided having a form similar to a single-element proximity-fed patch antenna, which is fabricated by additively depositing a first electrically conductive layer, a first dielectric layer, and a second electrically conductive layer. The first electrically conductive layer is deposited on a substrate and comprises a single conductive element with one or more branches. The first dielectric layer is composed of a cross-linked polymer and is deposited on the first conducive layer and on the substrate. The second electrically conductive layer is deposited on the first dielectric layer, and comprises multiple segments, each overlaid on the first conductive layer and electrically insulated from it and from the other segments of the second conductive layer.

In one embodiment, a passive electrical component is provided having a form similar to a multi-element proximity-fed patch antenna array, which is fabricated by additively depositing a first electrically conductive layer, a first dielectric layer, and a second electrically conductive layer. The first electrically conductive layer is deposited on a substrate. The first dielectric layer is composed of a cross-linked polymer and is deposited on the first conducive layer and on the substrate. The second electrically conductive layer is deposited on the first dielectric layer.

In another embodiment, a method of fabricating a passive electrical component is provided. The method includes additively depositing a first electrically conductive layer on a substrate, sintering the first electrically conductive layer, additively depositing a first dielectric layer on the first electrically conductive layer, curing the first dielectric layer, additively depositing a second electrically conductive layer on the first dielectric layer, and sintering the second electrically conductive layer. In this embodiment, the first electrically conductive layer and the second conductive layer, when deposited, comprise electrically conductive particles suspended in a liquid and the first dielectric layer comprises an uncured polymer.

In another embodiment, a method of fabricating a passive electrical component is provided. The method includes additively depositing a first dielectric layer on a silicon substrate, curing the first dielectric layer, and treating the first dielectric layer to modify its surface. The method further includes additively depositing a first electrically conductive layer on the treated silicon substrate, sintering the first electrically conductive layer, re-treating the first dielectric layer to again modify its surface, additively depositing a second dielectric layer on the first electrically conductive layer and on the treated silicon substrate, curing the second dielectric layer, additively depositing a second electrically conductive layer on the second dielectric layer and on the treated silicon substrate, and sintering the second electrically conductive layer. In this embodiment, the first electrically conductive layer and the second electrically conductive layer, during deposition, comprise electrically conductive particles suspended in a liquid and the first dielectric layer comprises an uncured polymer.

In a further embodiment, the first electrically conductive layer, the first dielectric layer, and the second electrically conductive layer are additively deposited using one or more inkjet printers.

In another embodiment, curing the first dielectric layer comprises exposing the first dielectric layer to ultraviolet radiation and/or heating the first dielectric layer.

In one embodiment, the first dielectric layer, before curing, comprises SU-8 polymer and cyclopentanone. In this embodiment, after curing the total thickness of the first dielectric layer is below 6 µm.

In one embodiment, the first dielectric layer, before curing, comprises poly(4-vinylphenol) (PVP), a cross-linking agent, and 1-hexanol. In this embodiment, after curing the total thickness of the first dielectric layer is below 1 µm.

In another embodiment, the first and second electrically conductive layers are cured by evaporating the liquid in which the electrically conductive particles are suspended and laser sintering the electrically conductive particles.

In another embodiment, the conductive particles comprise silver nanoparticles.

In another embodiment, the first and second electrically conductive layers, after sintering, each have a total thickness below 3 µm.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION

To facilitate an understanding of the principles and features of the present invention, various illustrative embodiments are explained below. To simplify and clarify explanation, the invention is described below as applied to passive electronic components. One skilled in the art will recognize, however, that the invention is not so limited. Instead, as those skilled in the art would understand, the various embodiments of the present invention also find application in other areas, including, but not limited to, active electronic components, microfluidics, and the like.

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention In one embodiment, a passive electrical component is provided comprising layers of insulative and conductive material additively deposited on a substrate. In one embodiment, the insulative and conductive materials are deposited in alternating layers on each other. In another embodiment, the insulative material is deposited directly on the substrate. In another embodiment, the conductive material is deposited directly on the substrate. Examples of more specific embodiments are detailed below.

Passive Electrical Components—Capacitor

Figure 1:
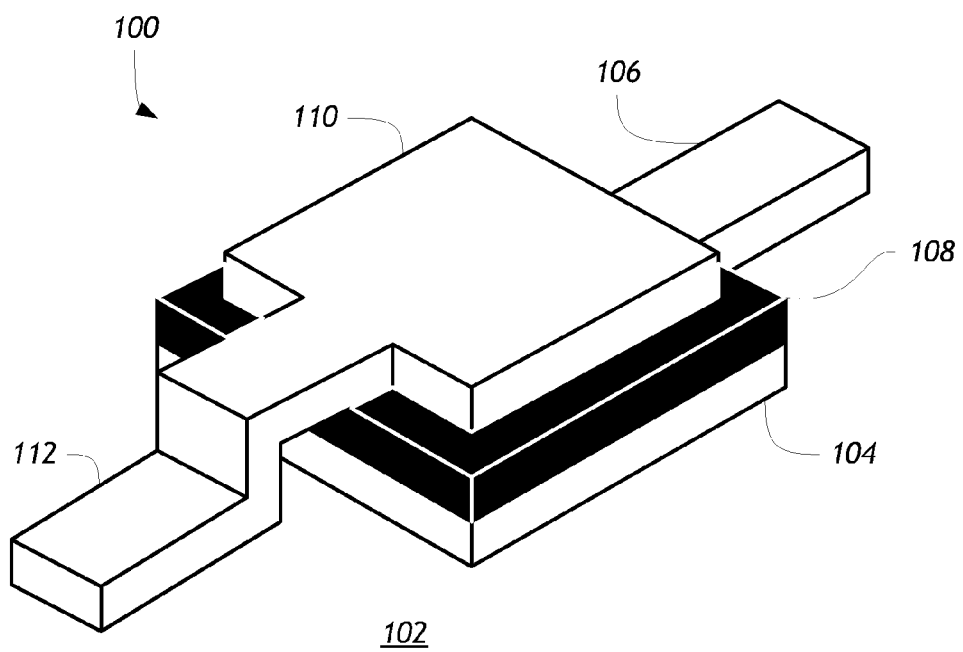
FIG. 1 is an isometric view of one embodiment of the passive electrical component, in accordance with the disclosure, illustrating the basic structure of a passive component in the form of an MIM capacitor.
Figure 2A:
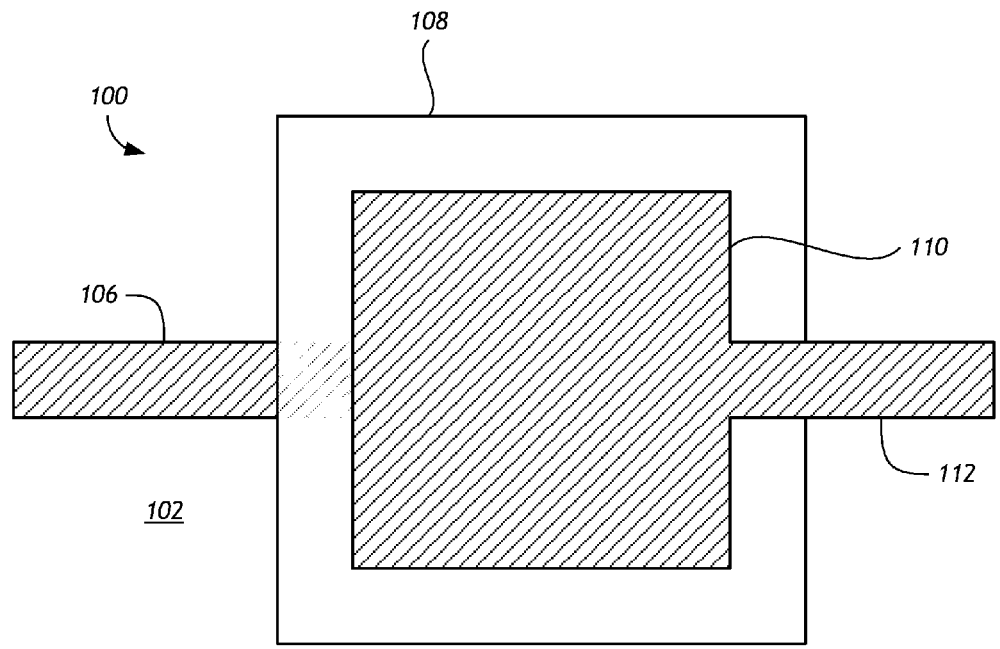
FIG. 2A is a plan view of one embodiment of the passive electrical component, in accordance with the disclosure, illustrating the basic structure of a passive component in the form of an MIM capacitor.
Figure 2B:
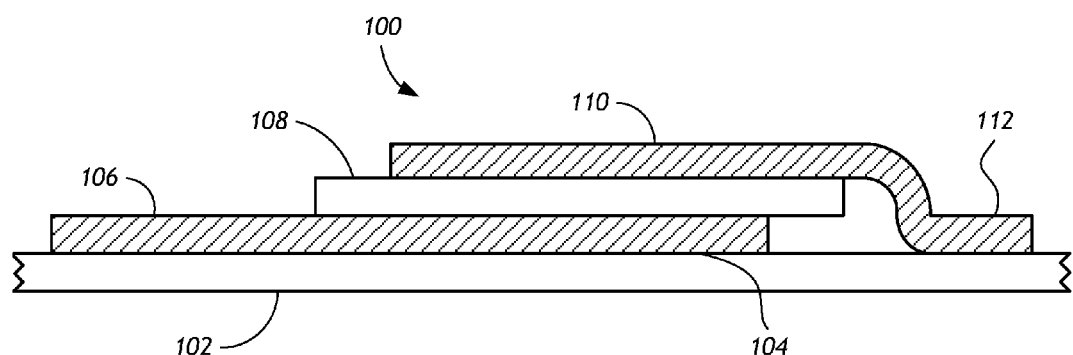
FIG. 2B is an elevation view of one embodiment of the passive electrical component, in accordance with the disclosure and FIG. 2A, and illustrating the basic structure of a passive component in the form of an MIM capacitor.

In one embodiment, a passive electrical component is provided having a form similar to a metal-insulator-metal (MIM) capacitor. FIGS. 1, 2A, and 2B depict one embodiment 100 of a passive electrical component. A passive electrical component 100 comprises a first electrically conductive layer 104 additively deposited on a substrate 102, a first dielectric layer 108 additively deposited on the first conductive layer 104, and a second electrically conductive layer 110 additively deposited on the first dielectric layer 108. The first electrically conductive layer 104 is electrically connected a terminal 106 which is also deposited on the substrate 102. The second electrically conductive layer 110 is electrically connected to a terminal 112 which is also deposited on the substrate 102. The first dielectric layer 108 is composed of a cross-linked polymer deposited on the first conducive layer.

The substrate 102 may be any nonconductive material, as is understood in the art. In one embodiment, the substrate 102 may be rigid. For example the substrate 102 may be FR-4 or G-10 fiberglass-reinforced composite. In another example, the substrate 102 may be glass or ceramic. In another example, the substrate 102 may be a nonconductive coating or film applied to a conductive material, such as metal. Those skilled in the art will appreciate that other rigid nonconductive substrates 102 may also be used.

In another embodiment, the substrate 102 is flexible. For example, the substrate 102 may be a polymer film including, but not limited to, liquid crystal polymer ("LCP"), polyimide, polyamide, polyvinyl chloride, polyethylene terephthalate, polybutylene terephthalate, polycarbonate, and fiber-bonded polyethylene. In another example, the substrate 102 may be paper or fabric. In another example, the substrate 102 may be a nonconductive coating or film applied to a conductive film, such as metal foil. Those skilled in the art will appreciate that other flexible nonconductive substrates 102 may also be used.

In another embodiment the substrate is silicon, including but not limited to a silicon wafer. In another embodiment, the silicon surface is partially or completely coated with a dielectric passivation layer to improve adhesion of subsequent layers. In one embodiment, this passivation layer comprises cross-linked SU-8 polymer. In one embodiment, the passivation layer is preferably between 10 and 30 µm thick. In another embodiment, the passivation layer is more preferably between 15 and 25 µm thick. In another embodiment, the passivation layer is most preferably between 19 and 21 µm thick. In one embodiment, the passivation layer has a surface roughness preferably between 40 and 65 nm. In another embodiment, the passivation layer has a surface roughness more preferably between 45 and 60 nm. In another embodiment, the passivation layer has a surface roughness most preferably between 50 and 55 nm. In one embodiment, the passivation layer has a surface energy preferably between 20 and 60 mN/m. In another embodiment, the passivation layer has a surface energy more preferably between 30 and 50 mN/m. In another embodiment, the passivation layer has a surface energy most preferably between 35 and 45 mN/m.

In another embodiment, the first electrically conductive layer 104 and second electrically conductive layer 110 are formed of deposited conductive particles. The particles may be any single conductive material or conductive combination material, as those skilled in the art will understand. For example, without limitation, the conductive particles may be metallic, carbon, or carbon coated in metal. As a further example, the conductive particles might be copper, graphite, carbon nanotubes, or nickel-plated graphite.

In one embodiment, the first electrically conductive layer 104 and second electrically conductive layer 110 comprise sintered silver nanoparticles. In this embodiment, the conductivity of each electrically conductive layer preferable exceeds $3 \times 10^6$ S/m. In another embodiment, the conductivity of each electrically conductive layer is more preferably exceeds $4 \times 10^6$ S/m. In another embodiment, the conductivity of each electrically conductive layer is most preferably exceeds $6 \times 10^6$ S/m.

In one embodiment, the first electrically conductive layer 104 and second electrically conductive layer 110 may comprise a single layer of conductive particles or multiple sub-layers of conductive particles. In another embodiment, the first electrically conductive layer 104 and second electrically conductive layer 110 may more preferable each comprise between two and four sub-layers. In another embodiment, the first electrically conductive layer 104 and second electrically conductive layer 110 may most preferable each comprise three sub-layers.

In one embodiment, the first electrically conductive layer 104 and second electrically conductive layer 110 each have a total thickness below 3 µm. In another embodiment, the first electrically conductive layer 104 and second electrically conductive layer 110 each have a total thickness more preferably between 1 µm and 2 µm. In another embodiment, the first electrically conductive layer 104 and second electrically conductive layer 110 each have a total thickness most preferably between 1.3 µm and 1.7 µm.

In one embodiment, the cross-linked polymer comprising the first dielectric layer 108 preferably has a molecular weight greater than 500. In another embodiment, the cross-linked polymer comprising the first dielectric layer 108 more preferably has a molecular weight greater than 1000. In another embodiment, the cross-linked polymer comprising the first dielectric layer 108 most preferably has a molecular weight greater than 5000.

In another embodiment, the first dielectric layer 108 contains the polymer SU-8. In this embodiment, the SU-8 first dielectric layer 108 preferably has a total thickness less than 6 µm. In another embodiment, the SU-8 first dielectric layer 108 preferably has a total thickness between 2 µm and 6 µm. In another embodiment, the SU-8 first dielectric layer 108 most preferably has a total thickness between 3 µm and 5 µm.

In another embodiment, the first dielectric layer comprises a polymer formed of a cured mixture of poly(4-vinylphenol) ("PVP") resin and poly melamine-co-formaldehyde ("PMF") cross-linking agent. This cured polymer is hereinafter referred to as "PVP." In one embodiment, the PVP first dielectric layer 108 preferably has a total thickness less than 2 µm. In another embodiment, the PVP first dielectric layer 108 preferably has a total thickness between 0.2 µm and 1.0 µm. In another embodiment, the PVP first dielectric layer 108 most preferably has a total thickness between 0.7 µm and 0.9 µm.

In one embodiment, the passive electrical component has a resonant frequency preferably exceeding 1 GHz. In another embodiment, the passive electrical component has a resonant frequency more preferably exceeding 2 GHz. In another embodiment, the passive electrical component has a resonant frequency most preferably exceeding 3 GHz.

In one embodiment, the passive electrical component has a capacitance preferably below 60 pF. In one embodiment, the passive electrical component has a capacitance more preferably below 30 pF. In one embodiment, the passive electrical component has a capacitance most preferably below 15 pF.

In another embodiment, the passive electrical component has a quality factor (Q-factor) preferably exceeding 2, at a signal frequency of 1 gigahertz. The quality factor is a measure of the losses experienced when a signal is applied to the passive component. In other words, the Q-factor is the inverse of the damping of a passive component. In another embodiment, the passive electrical component has a Q-factor more preferably exceeding 10, at a signal frequency of 1 gigahertz. In another embodiment, the passive electrical component has a Q-factor most preferably exceeding 30, at a signal frequency of 1 gigahertz.

In another embodiment, the passive electrical component further includes at least one surface-mounted connector, as understood in the art, which is electrically connected to either the first or second electrically conductive layers. Additional surface-mounted connectors may be connected to either the first or second electrically conductive layers, as required.

Passive Electrical Components—RF Patch Antenna

Figure 4:
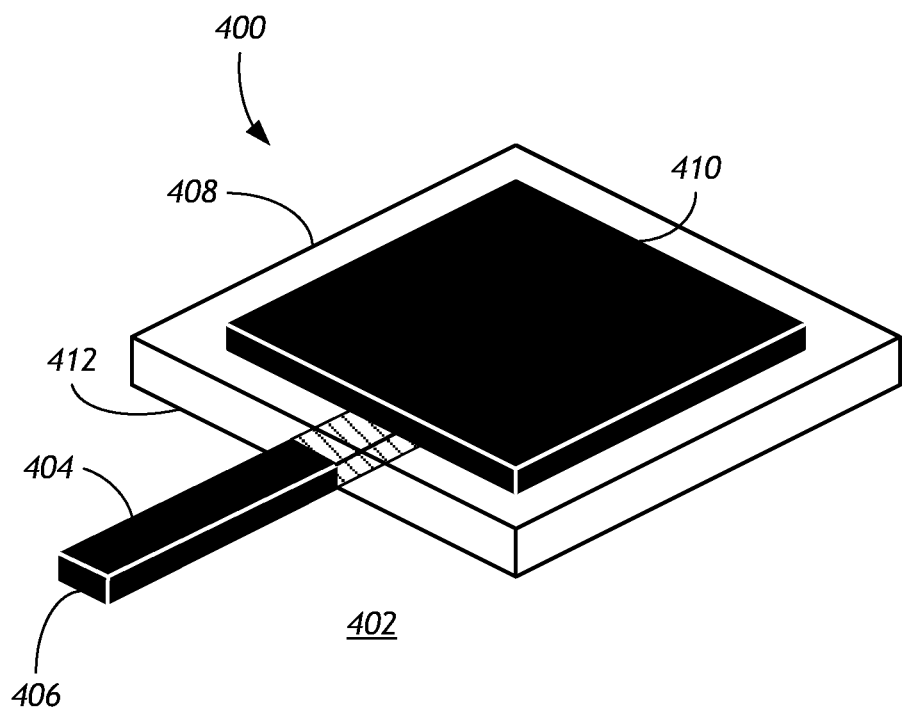
FIG. 4 is an isometric view of another embodiment of the passive electrical component illustrating the passive electrical component in the form of a proximity-fed patch antenna.

In one embodiment, a passive electrical component is provided having a form similar to a proximity-fed patch antenna. FIG. 4 depicts one embodiment 400 of a passive electrical component. A passive electrical component 400 comprises a first electrically conductive layer 404 additively deposited on a substrate 402, a first dielectric layer 408 additively deposited on the first conductive layer 404, and a second electrically conductive layer 410 additively deposited on the first dielectric layer 408. The first electrically conductive layer 404 is electrically insulated from the second conductive layer 410. The first electrically conductive layer 404 is extended past the edge 412 of the dielectric layer 408 to form a terminal 406 which is also deposited on the substrate 402. The first dielectric layer 408 is composed of a cross-linked polymer deposited on the first conducive layer.

The substrate 402 may be any nonconductive material, as is understood in the art. In one embodiment, the substrate 402 may be rigid. For example the substrate 102 may be FR-4 or G-10 fiberglass-reinforced composite. In another example, the substrate 102 may be glass or ceramic. Those skilled in the art will appreciate that other rigid nonconductive substrates 402 may also be used.

In another embodiment, the substrate 402 is flexible. For example, the substrate 402 may be a polymer film including, but not limited to, liquid crystal polymer ("LCP"), polyimide, polyamide, polyvinyl chloride, polyethylene terephthalate, polybutylene terephthalate, polycarbonate, and fiber-bonded polyethylene. In another example, the substrate 102 may be paper or fabric. Those skilled in the art will appreciate that other flexible nonconductive substrates 402 may also be used In one embodiment, the first dielectric layer 408 may be a cross-linked polymer as disclosed above. In another embodiment, the first dielectric layer 408 contains the polymer SU-8, as disclosed above. In another embodiment, the first dielectric layer may be a polymer formed of a cured mixture of PVP resin and PMF cross-linking agent, as disclosed above. In one embodiment, the first dielectric layer will preferably have a thickness between 30 and 50 µm. In another embodiment, the first dielectric layer will more preferably have a thickness between 35 and 45 µm. In another embodiment, the first dielectric layer will most preferably have a thickness between 38 and 42 µm. In one embodiment, the first dielectric layer may be deposited in a single layer. In another embodiment, the first dielectric layer may be deposited in multiple sub-layers. In another embodiment, the first dielectric layer may more preferably be deposited in six layers.

In one embodiment, the conductive layers will preferably have a thickness between 0.5 and 5 µm. In another embodiment, the conductive layers will more preferably have a thickness between 1 and 3 µm. In one embodiment, the conductive layers may be deposited in a single layer. In another embodiment, the conductive layers may be deposited in multiple sub-layers. In another embodiment, the conductive layers may more preferably be deposited in three to five layers.

One skilled in the art will appreciate that the thickness of the dielectric layers and the conductive layers can be modified to achieve different desired performance characteristics. These performance characteristics can be specifically tuned for optimal performance within specific signal frequency bands.

Figure 5:
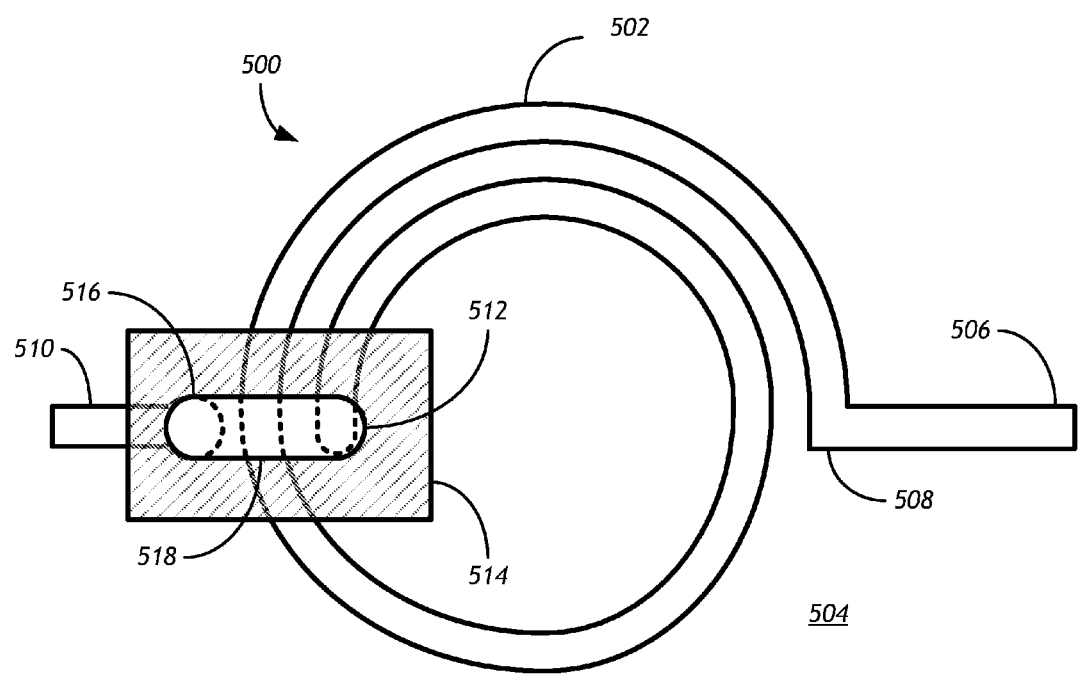
FIG. 5 is a plan view of one embodiment of the passive electrical component, in accordance with the disclosure, illustrating the basic structure of a passive component in the form of a spiral-wound inductor.

In another embodiment, the passive electrical component further includes at least one surface-mounted connector, as understood in the art, which is electrically connected to either the first or conductive layers Passive Electrical Components—Spiral Inductor In one embodiment, a passive electrical component is provided having a form similar to a spiral inductor. FIG. 5 depicts one embodiment 500 of a passive electrical component. A passive electrical component 500 comprises a first electrically conductive layer 502 additively deposited on a substrate 504 in a spiral shape having 1.5 turns and also having one straight lead 506 connected to the outer terminus 508 of the spiral and a second straight disconnected lead 510, terminating near the inner terminus 512 of the spiral, and located outside of the spiral. The passive electrical component further comprises a first dielectric layer 514 additively deposited on the first conductive layer 502 and the substrate 502 and extending from the inner terminus 512 of the spiral to the second straight disconnected lead 510, but leaving the inner terminus 512 of the spiral and one terminus 516 of the second straight disconnected lead 510 exposed. The passive electrical component further comprises a second electrically conductive layer 518 additively deposited on the first dielectric layer 514 and electrically connecting the inner terminus 512 of the spiral with the exposed terminus 516 of the second straight lead 510. The first dielectric layer 514 is composed of a cross-linked polymer deposited on the first conducive layer.

The substrate 504 may be any nonconductive material, as is understood in the art and disclosed above. In another embodiment, the first electrically conductive layer 502 and second electrically conductive layer 518 are formed of deposited conductive particles, as disclosed above, including sintered silver nanoparticles.

In one embodiment, the first dielectric layer 514 may be a cross-linked polymer as disclosed above. In another embodiment, the first dielectric layer 514 contains the polymer SU-8, as disclosed above. In another embodiment, the first dielectric layer may be a polymer formed of a cured mixture of PVP resin and PMF cross-linking agent, as disclosed above. In one embodiment, the passive electrical component has an inductance preferably exceeding 1 nanoHenry (nH). In another embodiment, the passive electrical component has an inductance more preferably exceeding 2 nH. In another embodiment, the passive electrical component has an inductance most preferably exceeding 5 nH. One skilled in the art will understand that different inductances may be achieved as desired by altering the geometry and the number of turns of the spiral.

In another embodiment, the passive electrical component has a quality factor (Q-factor) preferably exceeding 5, at a signal frequency of 1 gigahertz. In another embodiment, the passive electrical component has a Q-factor more preferably exceeding 10, at a signal frequency of 1 gigahertz. In another embodiment, the passive electrical component has a Q-factor most preferably exceeding 15, at a signal frequency of 1 gigahertz.

In another embodiment, the passive electrical component further includes at least one surface-mounted connector, as understood in the art, which is electrically connected to either the connected lead 506 or the disconnected lead 510. Additional surface-mounted connectors may be connected to either lead as required.

Methods of Fabrication

Figure 3:
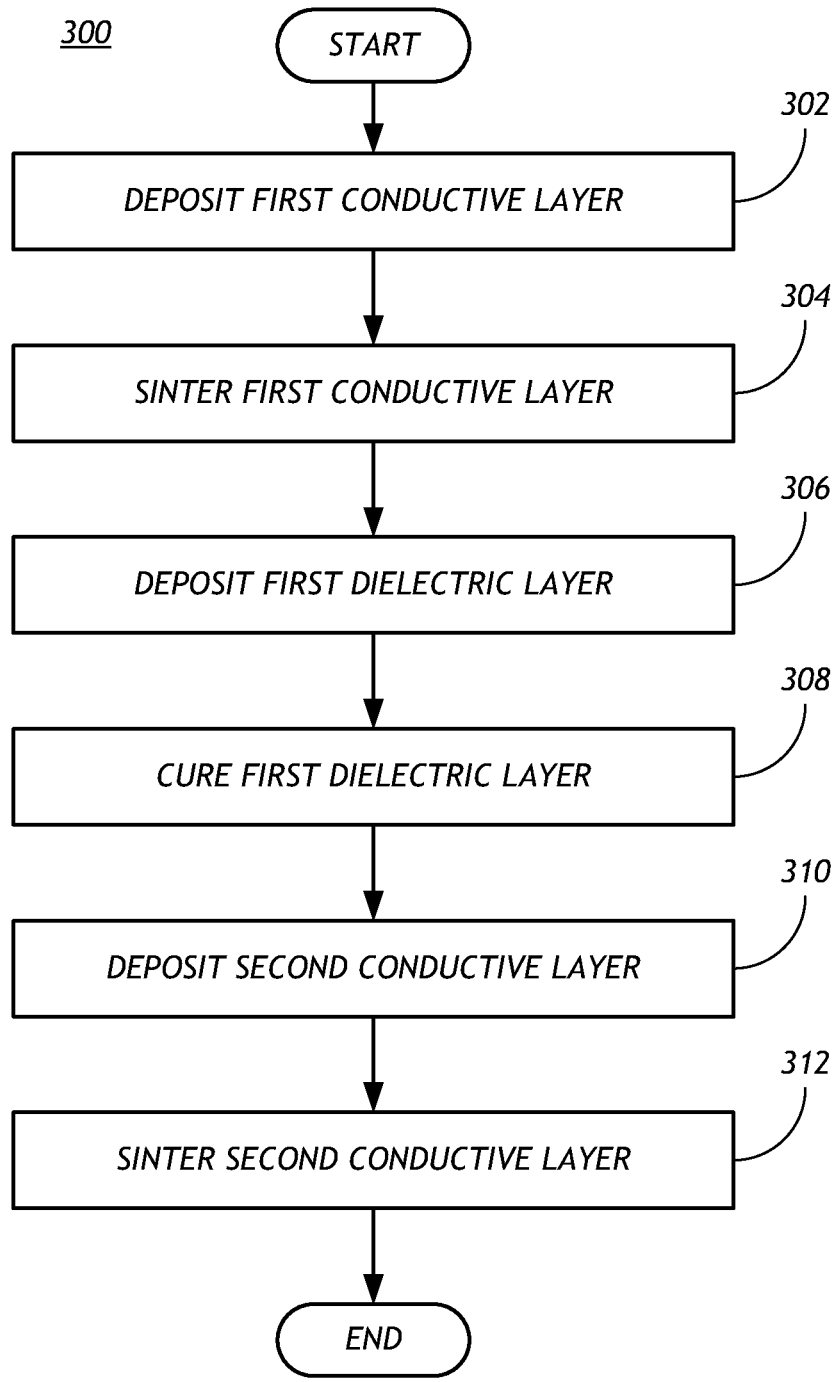
FIG. 3 is a flow chart illustrating one exemplary method of fabricating the disclosed passive electrical component, in accordance with the disclosure.

In another embodiment, illustrated in FIG. 3, a method 300 of fabricating a passive electrical component is provided. At 302 a first electrically conductive layer is additively deposited on a substrate. At 304 the first electrically conductive layer is sintered. At 306 a first dielectric layer is additively deposited on the first electrically conductive layer. At 308 the first dielectric layer is cured. At 310 a second electrically conductive layer is additively deposited on the first dielectric layer. At 312 the second electrically conductive layer is sintered.

In another embodiment, the first electrically conductive layer and the second conductive layer, when deposited, comprise electrically conductive particles suspended in a liquid and the first dielectric layer comprises an uncured polymer and a solvent.

In another embodiment, the first electrically conductive layer, the first dielectric layer, and the second electrically conductive layer are additively deposited using one or more inkjet printers. In another embodiment the inkjet printers further comprise one or more piezoelectric print heads.

In one embodiment, the dielectric layer is deposited as a mixture containing the polymer SU-8 and a solvent. In another embodiment, the solvent is cyclopentanone. In a preferred embodiment, the mixture contains between 25% and 50% by weight SU-8, the balance being cyclopentanone. In another embodiment, the mixture more preferably contains between 30% and 40% by weight SU-8, the balance being cyclopentanone. In another embodiment, the mixture most preferably contains between 32% and 37% by weight SU-8, the balance being cyclopentanone.

In one embodiment, the SU-8 mixture is additively deposited in drops preferably between 10 μm and 50 μm apart. In another embodiment, the SU-8 mixture is additively deposited in drops more preferably between 15 μm and 40 μm apart. In another embodiment, the SU-8 mixture is additively deposited in drops most preferably between 25 μm and 35 μm apart. In another embodiment, the SU-8 mixture is additively deposited in drops most preferably between 15 μm and 25 μm apart.

In one embodiment, the SU-8 mixture is cured by cross-linking the polymer. In another embodiment, and not in limitation, the SU-8 mixture is cross-linked by exposure to ultraviolet (UV) radiation. In another embodiment, and not in limitation, the SU-8 mixture is cross-linked by heating it to 50° C. In another embodiment, and not in limitation, the SU-8 mixture is more preferably cross-linked by heating it to 50° C. for thirty minutes. In another embodiment, and not in limitation, the SU-8 mixture is most preferably cross-linked by exposing to UV radiation and heating it to 50° C. for thirty minutes.

In another embodiment, the SU-8 mixture is cured by pre-heating it, exposing it UV radiation, post-heating it, and exposing it to UV and ozone (UVO). In one embodiment, the pre-heating and post-heating are performed by placing the work piece, with the additively-deposited SU-8 mixture, in an oven at a set temperature. In one embodiment, the pre-heat oven is preferably set between 80 and 100° C. In another embodiment, the pre-heat oven is more preferably set between 85 and 95° C. In another embodiment, the pre-heat oven is most preferably set at 90° C. In one embodiment, the post-heat oven is preferably set between 110 and 130° C. In another embodiment, the post-heat oven is more preferably set between 115 and 125° C. In another embodiment, the pre-heat oven is most preferably set at 120° C.

In one embodiment, the UV radiation preferably has a wavelength between 350 and 380 nm. In another embodiment, the UV radiation more preferably has a wavelength between 360 and 370 nm. In another embodiment, the UV radiation most preferably has a wavelength of 365 nm.

In one embodiment, and not in limitation, the SU-8 mixture may be deposited in a single pass. In another embodiment, and not in limitation, the SU-8 mixture may be deposited in multiple passes. In another embodiment, and not in limitation, the SU-8 mixture may preferably be deposited two passes.

In one embodiment, the dielectric layer is deposited as a mixture containing the PVP powder, PMF, and a solvent. All mixtures containing these components are hereinafter referred to as "PVP mixture." In another embodiment, the solvent is 1-hexanol. In a preferred embodiment, the mixture contains between 0.25% and 1.00% by weight PVP powder and between 0.025% and 0.10% by weight PMF, the balance being 1-hexanol. In more preferred embodiment, the mixture contains between 0.35% and 0.75% by weight PVP powder and between 0.03% and 0.08% by weight PMF, the balance being 1-hexanol. In a most preferred embodiment, the mixture contains between 0.45% and 0.65% by weight PVP powder and between 0.045% and 0.065% by weight PMF, the balance being 1-hexanol.

In another preferred embodiment, the mixture contains between 1.0% and 3.0% by weight PVP powder and between 1.0% and 3.0% by weight PMF, the balance being 1-hexanol. In more preferred embodiment, the mixture contains between 1.5% and 2.5% by weight PVP powder and between 1.5% and 2.5% by weight PMF, the balance being 1-hexanol. In a most preferred embodiment, the mixture contains between 1.75% and 2.25% by weight PVP powder and between 1.75% and 2.25% by weight PMF, the balance being 1-hexanol.

In one embodiment, the PVP mixture is additively deposited on a room-temperature substrate. In another embodiment, the PVP mixture is additively deposited on a substrate heated to between 40 and 50° C.

In one embodiment, the PVP mixture is additively deposited in drops preferably between 10 μm and 30 μm apart. In another embodiment, the PVP mixture is additively deposited in drops more preferably between 15 μm and 25 μm apart. In another embodiment, the PVP mixture is additively deposited in drops most preferably between 18 μm and 22 μm apart.

In one embodiment, the PVP mixture is cured by cross-linking the polymer components. In another embodiment, and not in limitation, the PVP mixture is preferably cross-linked by heating it from 50° C. to between 160° C. and 200° C. In another embodiment, and not in limitation, the PVP mixture is more preferably cross-linked by heating it from 50° C. to between 170° C. and 190° C. In another embodiment, and not in limitation, the PVP mixture is most preferably cross-linked by heating it from 50° C. to between 175° C. and 185° C. In another embodiment, and not in limitation, the PVP mixture is preferably cross-linked by holding it at peak temperature for 1 to 10 minutes. In another embodiment, and not in limitation, the PVP mixture is more preferably cross-linked by holding it at peak temperature for 3 to 7 minutes. In another embodiment, and not in limitation, the PVP mixture is most preferably cross-linked by holding it at peak temperature for 4 to 6 minutes.

In one embodiment, and not in limitation, the PVP mixture may be deposited in a single pass. In another embodiment, and not in limitation, the PVP mixture may be deposited in multiple passes. In another embodiment, and not in limitation, the PVP mixture may preferably be deposited two passes.

In one embodiment, the conductive layers are deposited as a mixture ("conductive mixture") containing the conductive particles and a solvent. In another embodiment, the conductive particles are silver nano-particles.

In one embodiment, and not in limitation, the conductive mixture is sintered by heating it to between 100° C. and 140° C. In another embodiment, and not in limitation, the conductive mixture is more preferably sintered by heating it to between 110° C. and 130° C. In another embodiment, and not in limitation, the conductive mixture is most preferably sintered by heating it to between 115° C. and 125° C. In another embodiment, and not in limitation, the conductive mixture is preferably sintered by heating for 30 to 90 minutes. In another embodiment, and not in limitation, the conductive mixture is more preferably sintered by heating for 45 to 75 minutes. In another embodiment, and not in limitation, the conductive mixture is most preferably sintered by heating for 55 to 65 minutes.

In one embodiment, and not in limitation, the conductive mixture is sintered by heating it to between 170° C. and 190° C. In another embodiment, and not in limitation, the conductive mixture is more preferably sintered by heating it to between 175° C. and 185° C. In another embodiment, and not in limitation, the conductive mixture is most preferably sintered by heating it to between 178° C. and 182° C. In another embodiment, and not in limitation, the conductive mixture is preferably sintered by heating for 20 to 40 minutes. In another embodiment, and not in limitation, the conductive mixture is more preferably sintered by heating for 25 to 35 minutes. In another embodiment, and not in limitation, the conductive mixture is most preferably sintered by heating for 28 to 32 minutes.

In another embodiment, the conductive mixture is cured by laser sintering. In this embodiment, the solvent is evaporated. After the solvent evaporates, a laser is used to sinter the conductive particles, as may be understood by those skilled in the art. In another embodiment, the laser is raster-scanned over the additively-deposited conductive mixture. In another embodiment, the laser has a power preferably between 50 and 100 Watts (W). In another embodiment, the laser has a power more preferably between 60 and 90 W. In another embodiment, the laser has a power most preferably between 70 and 80 W. In another embodiment, the laser has a wavelength preferably between 1 and 20 μm. In another embodiment, the laser has a wavelength more preferably between 5 and 15 μm. In another embodiment, the laser has a wavelength most preferably between 8 and 12 μm. In a further embodiment, the sintered particles are silver nano-particles.

In one embodiment, and not in limitation, the conductive mixture may be deposited in a single pass. In another embodiment, and not in limitation, the conductive mixture may be deposited in multiple passes. In another embodiment, and not in limitation, the conductive mixture may preferably be deposited in three passes.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A passive electrical component comprising:
    a substrate;
    a first electrically conductive layer additively deposited on the substrate;
    a first dielectric layer having a total thickness below 6 micrometers additively deposited on the first conductive layer, wherein the first dielectric layer comprises, at least a cured mixture of poly(4-vinylphenol) (PVP) resin and poly melamine-co-formaldehyde cross-linking agent; and
    a second electrically conductive layer additively deposited on the first dielectric layer;
    wherein a resonant frequency of the passive electrical component exceeds 1 gigahertz.

2. The passive electrical component of claim 1, wherein the passive electrical component has a capacitance below 60 picofarads.

3. The passive electrical component of claim 1, wherein the passive electrical component has a quality factor (Q-factor) above 2 at a signal frequency of 1 gigahertz.

4. The passive electrical component of claim 1, wherein the cured mixture of PVP and PMF has a molecular weight greater than 500.

5. The passive electrical component of claim 1, wherein the substrate is flexible.

6. The passive electrical component of claim 1, wherein the substrate comprises silicon.

7. The passive electrical component of claim 1,
    wherein the first dielectric layer comprises a total thickness below 1 micrometer.

8. A passive electrical component comprising:
    a substrate;
    a first electrically conductive layer additively deposited on the substrate;
    a first dielectric layer additively deposited on the first conductive layer, wherein the first dielectric layer comprises a cross-linked polymer; and
    a second electrically conductive layer additively deposited on the first dielectric layer;
    wherein a resonant frequency of the passive electrical component exceeds 1 gigahertz;
    wherein the first and second electrically conductive layers comprise sintered silver nanoparticles;
    wherein the conductivity of each electrically conductive layer exceeds $3 \times 10^6$ S/m; and
    wherein the first and second electrically conductive layers each have a total thickness below 3 micrometers.

9. The passive electrical component of claim 8, wherein the passive electrical component has a capacitance below 60 picofarads.

10. The passive electrical component of claim 8, wherein the passive electrical component has a quality factor (Q-factor) above 2 at a signal frequency of 1 gigahertz.

11. The passive electrical component of claim 8, wherein the cross-linked polymer has a molecular weight greater than 500.

12. The passive electrical component of claim 8, wherein the substrate is flexible.

13. The passive electrical component of claim 8, wherein the substrate comprises silicon.

14. The passive electrical component of claim 8, wherein the first dielectric layer comprises a total thickness below 1 micrometer.

15. A passive electrical component comprising:
a substrate;
a first electrically conductive layer additively deposited on the substrate;
a first dielectric layer additively deposited on the first conductive layer, wherein the first dielectric layer comprises a cross-linked polymer;
a second electrically conductive layer additively deposited on the first dielectric layer; and
at least one surface-mount connector electrically connected to at least one of:
the first electrically conductive layer, and
the second electrically conductive layer;
wherein a resonant frequency of the passive electrical component exceeds 1 gigahertz.

16. The passive electrical component of claim 15, wherein the passive electrical component has a capacitance below 60 picofarads.

17. The passive electrical component of claim 15, wherein the passive electrical component has a quality factor (Q-factor) above 2 at a signal frequency of 1 gigahertz.

18. The passive electrical component of claim 15, wherein the cross-linked polymer has a molecular weight greater than 500.

19. The passive electrical component of claim 15, wherein the substrate is flexible.

20. The passive electrical component of claim 15, wherein the substrate comprises silicon.

21. The passive electrical component of claim 15, wherein the first dielectric layer comprises a total thickness below 1 micrometer.

22. A passive electrical component comprising:
a substrate;
a first electrically conductive layer additively deposited on the substrate, wherein the first electrically conductive layer comprises a first element comprising a spiral and a lead, and a second element, physically and electrically isolated from the first, comprising a lead;
a first dielectric layer, comprising a cross-linked polymer, additively deposited on the substrate and the first electrically conductive layer, the first dielectric layer further comprising two or more deposition-free regions forming vias to the first electrically conductive layer; and
a second electrically conductive layer additively deposited on the first dielectric layer, wherein the second electrically conductive layer connects the deposition-free regions of the first dielectric layer, forming a conductive path between the vias.

23. The passive electrical component of claim 22, wherein the passive electrical component has a capacitance below 60 picofarads.

24. The passive electrical component of claim 22, wherein the passive electrical component has a quality factor (Q-factor) above 2 at a signal frequency of 1 gigahertz.

25. The passive electrical component of claim 22, wherein the cross-linked polymer has a molecular weight greater than 500.

26. The passive electrical component of claim 22, wherein the substrate is flexible.

27. The passive electrical component of claim 22, wherein the substrate comprises silicon.

28. The passive electrical component of claim 22, wherein the first dielectric layer comprises a total thickness below 1 micrometer.

29. A method of fabricating a passive electrical component, comprising:
additively depositing a first electrically conductive layer on a flexible substrate, wherein the first electrically conductive layer comprises electrically conductive particles suspended in a liquid;
curing the first electrically conductive layer;
additively depositing a first dielectric layer on the first electrically conductive layer, wherein the first dielectric layer comprises an uncured polymer;
curing the first dielectric layer;
additively depositing a second electrically conductive layer on the first dielectric layer, wherein the second electrically conductive layer comprises electrically conductive particles suspended in a liquid; and
curing the second electrically conductive layer.

30. The method of claim 29, wherein the first electrically conductive layer, the first dielectric layer, and the second electrically conductive layer are additively deposited using one or more inkjet printers.

31. The method of claim 29, wherein curing the first dielectric layer comprises at least one of:
exposing the first dielectric layer to ultraviolet radiation; and
heating the first dielectric layer.

32. The method of claim 29, wherein the first dielectric layer before curing comprises SU-8 polymer and cyclopentanone; and
wherein the first dielectric layer, after curing, comprises a total thickness below 7 micrometers.

33. The method of claim 29, wherein the first dielectric layer before curing comprises poly(4-vinylphenol) (PVP) and 1-hexanol; and
wherein the first dielectric layer, after cross-linking, comprises a total thickness below 1 micrometer.

34. The method of claim 29, wherein curing the first and second electrically conductive layers comprises:
evaporating the liquid in which the electrically conductive particles are suspended; and
laser sintering the electrically conductive particles.

35. The method of claim 34, wherein the conductive particles comprise silver nanoparticles.

36. The method of claim 35, wherein the first and second electrically conductive layers, after sintering, each comprises a total thickness below 3 micrometers.

* * * * *